United States Patent
Skeete

(10) Patent No.: US 10,608,042 B2
(45) Date of Patent: Mar. 31, 2020

(54) SEMICONDUCTOR PACKAGE WITH CHAMFERED CORNERS AND RELATED METHODS

(71) Applicant: SEMICONDUCTOR COMPONENTS INDUSTRIES, LLC, Phoenix, AZ (US)

(72) Inventor: Oswald L. Skeete, Phoenix, AZ (US)

(73) Assignee: SEMICONDUCTOR COMPONENTS INDUSTRIES, LLC, Pheonix, AZ (US)

(*) Notice: Subject to any disclaimer, the term of this patent is extended or adjusted under 35 U.S.C. 154(b) by 0 days.

(21) Appl. No.: 16/419,454

(22) Filed: May 22, 2019

(65) Prior Publication Data

US 2019/0273111 A1    Sep. 5, 2019

Related U.S. Application Data

(63) Continuation of application No. 15/892,114, filed on Feb. 8, 2018, now Pat. No. 10,340,306.

(51) Int. Cl.
*H01L 27/146* (2006.01)
*H01L 21/02* (2006.01)

(52) U.S. Cl.
CPC .. *H01L 27/14687* (2013.01); *H01L 27/14607* (2013.01); *H01L 27/14618* (2013.01); *H01L 27/14632* (2013.01); *H01L 21/02019* (2013.01); *H01L 21/02021* (2013.01)

(58) Field of Classification Search
None
See application file for complete search history.

(56) References Cited

U.S. PATENT DOCUMENTS

| | | | |
|---|---|---|---|
| 5,291,010 A | 3/1994 | Tsuji | |
| 7,462,807 B2* | 12/2008 | Caupain | H01L 27/1463 250/208.1 |
| 8,916,980 B2* | 12/2014 | Dai | H01L 27/14618 257/432 |
| 9,559,007 B1 | 1/2017 | Truhitte | |
| 2001/0023979 A1* | 9/2001 | Brouvillette | B23D 59/002 257/622 |
| 2007/0190747 A1* | 8/2007 | Humpston | B81C 1/00285 438/460 |
| 2008/0024635 A1 | 1/2008 | Liu et al. | |

(Continued)

FOREIGN PATENT DOCUMENTS

| | | |
|---|---|---|
| CN | 103066095 B | 1/2016 |
| WO | 2017094502 A1 | 6/2017 |

OTHER PUBLICATIONS

Definition of alignment downloaded from URL<https://www.merriam-webster.com/dictionary/align on Aug. 10, 201 (Year: 2019).*

(Continued)

*Primary Examiner* — J. E. Schoenholtz
(74) *Attorney, Agent, or Firm* — Adam R. Stephenson, Ltd.

(57) ABSTRACT

Implementations of image sensors may include a die having either a rounded corner or a chamfered corner edge, and an optically transmissive cover coupled to the die. The optically transmissive cover may include either a rounded corner or a chamfered corner edge that corresponds with either the rounded corner or the chamfered corner edge of the die.

17 Claims, 3 Drawing Sheets

(56) References Cited

U.S. PATENT DOCUMENTS

| | | | |
|---|---|---|---|
| 2008/0220220 A1* | 9/2008 | Wang | H01L 23/13 |
| | | | 428/192 |
| 2010/0019354 A1* | 1/2010 | Farooq | H01L 21/67092 |
| | | | 257/620 |
| 2010/0052192 A1 | 3/2010 | Hasegawa et al. | |
| 2016/0172402 A1 | 6/2016 | Katkar | |
| 2017/0110436 A1 | 4/2017 | Truhitte | |

OTHER PUBLICATIONS

Definition of 'lineup' downloaded from URL< https://www.merriam-webster.com/dictionary/lineup> on Aug. 12, 2019. (Year: 2019).*

* cited by examiner

SEMICONDUCTOR PACKAGE WITH CHAMFERED CORNERS AND RELATED METHODS

CROSS REFERENCE TO RELATED APPLICATIONS

This application is a continuation application of the earlier U.S. Utility patent application to Oswald Skeete entitled "Semiconductor Package with Chamfered Corners and Related Methods," application Ser. No. 15/892,114, filed Feb. 8, 2018, the disclosure of which is hereby incorporated entirely herein by reference.

BACKGROUND

1. Technical Field

Aspects of this document relate generally to image sensors, such as chip scale image sensors. More specific implementations involve image sensors with rounded or chamfered corners.

2. Background

A chip scale package (CSP) is designed to be the same size as, or nearly the same size as, the semiconductor die (chip) itself. Various CSP packages include various types of semiconductor die, including image sensors. Image sensors convey information related to an image by communicating signals in response to incident electromagnetic radiation. Image sensors are used in a variety of devices including smart phones, digital cameras, night vision devices, medical imagers, and many others.

SUMMARY

Implementations of image sensors may include a die having either a rounded corner or a chamfered corner edge, and an optically transmissive cover coupled to the die. The optically transmissive cover may include either a rounded corner or a chamfered corner edge that corresponds with either the rounded corner or the chamfered corner edge of the die.

Implementations of image sensors may include one, all, or any of the following:

The corners of the die may be convexly rounded.

The corners of the die may be concavely rounded.

The optically transmissive cover may include glass.

Either the rounded corner or the chamfered corner edge of the die may be formed through etching.

Implementations of a method for forming an image sensor device may include forming a first plurality of openings in an optically transmissive cover, coupling the optically transmissive cover to a wafer comprising a plurality of image sensors, etching a second plurality of openings through the wafer, the second plurality of openings aligning with the first plurality of openings in the optically transmissive cover, and singulating the optically transmissive cover and the wafer into a plurality of image sensor devices. Each image sensor device may include either a rounded corner or a chamfered corner edge.

Implementations of image sensors may include one, all, or any of the following:

Etching one or more through-silicon-vias while etching the second plurality of openings through the wafer.

Each opening of the first plurality of openings may include a perimeter in a closed four-sided shape.

Each opening of the first plurality of openings may include a perimeter in a circular shape.

Each opening of the first plurality of openings may include a perimeter in an elliptical shape.

The optically transmissive cover may include glass.

The first plurality of openings may be formed through etching.

The method may include aligning the first plurality of openings of the optically transmissive cover with a plurality of corners of the plurality of image sensors.

The method may include etching the second plurality of holes through the wafer while using the optically transmissive cover as a guide.

Implementations of a method for forming an image sensor device may include forming a first plurality of openings in an optically transmissive cover, coupling the optically transmissive cover to a wafer including a plurality of image sensors, using the optically transmissive cover as a guide, etching a second plurality of openings through the wafer, and singulating the optically transmissive cover and the wafer into a plurality of image sensor devices. Each image sensor device may include either a rounded corner or a chamfered corner edge.

Implementations of image sensors may include one, all, or any of the following:

Each opening of the first plurality of openings may include a perimeter in a closed four-sided shape.

Each opening of the first plurality of openings may include a perimeter in a circular shape.

Each opening of the first plurality of openings may include a perimeter in an elliptical shape.

The optically transmissive cover may include glass.

The second plurality of openings may be formed through a deep reactive ion etching process.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
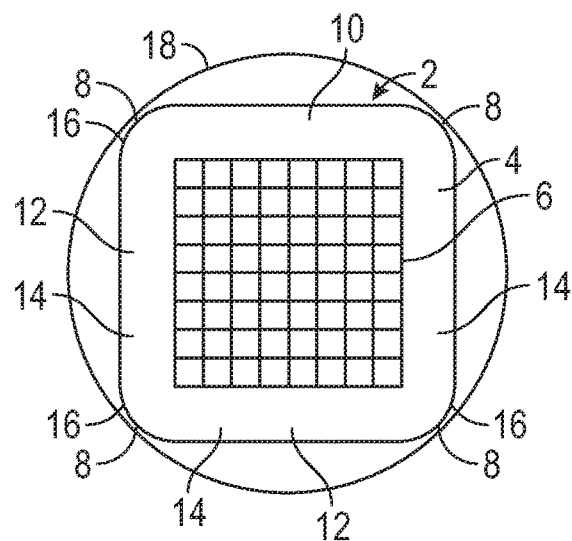
FIG. 1 is a top view of an image sensor with rounded corners.

Referring to FIG. 1, a top view of an image sensor with rounded corners is illustrated. The image sensors disclosed herein may be chip scale image sensors or any other image sensor known to those of ordinary skill in the art. Also, the principles disclosed herein may be applied to more semiconductor packages and device types than image sensors, including, by non-limiting example, processors, power devices, discrete components, and any other device formed on a semiconductor substrate. As illustrated by FIG. 1, the image sensor 2 includes a die 4 that includes a pixel array 6. In various implementations, the image sensor may also include rounded corners 8. The rounded corners may vary in size from very small rounded corners on an basically rectangular die, to very large rounded corners that make the image sensor die nearly circular. In the implementation illustrated by FIG. 1, the rounded corners 8 are convex rounded corners, however, in other implementations, the rounded corners may be concave rounded corners with the arc of the corner extending towards the center of the die rather than away from the die.

In various implementations, the image sensor 2 may include an optically transmissive cover 10 coupled to the die 4. In various implementations the optically transmissive cover 10 is coupled directly to the die, however, in other implementations there may be various elements between the die 4 and the optically transmissive cover 10. In various implementations the optically transmissive cover is coupled to the die through an adhesive or other bonding material. The adhesive may bond the edges 12 of the die 4 to the edges 14 of the optically transmissive cover 10. The optically transmissive cover 10 may be optically transparent or optically translucent. In particular implementations, the optically transmissive cover 10 may be, by non-limiting example, glass, sapphire, or any other optically transmissive material. The optically transmissive cover 10 may include corners 16 that correspond to the corners of the die 4. As is the case illustrated by FIG. 1, the corners of the optically transmissive cover 16 may be convexly rounded, though in other implementations, the corners may be concavely rounded.

An optical element 18, such as a lens holder, may be also coupled to the image sensor 2. The optical element 18 may be circular, as is often the case with optical elements added to image sensors that make up a full camera system. As illustrated by FIG. 1, the perimeter of the image sensor 2 fits within the circular optical element 18.

Figure 2:
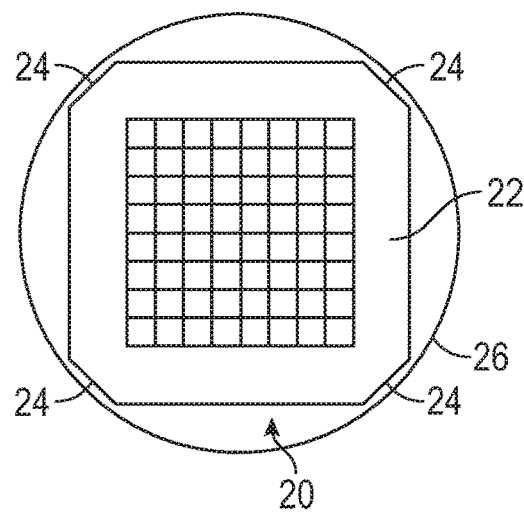
FIG. 2 is a top view of an image sensor with chamfered corner edges.

Referring to FIG. 2, a top view of an image sensor with chamfered corner edges is illustrated. The image sensor 20 of FIG. 2 is essentially the same as the image sensor 2 of FIG. 1, with the exception that rather than having rounded corners, the image sensor 20, including the die 22 and the optically transmissive cover, has chamfered corner edges 24. The length of the chamfered corner edges may vary. As illustrated by FIG. 2, a perimeter of the image sensor 20 is configured to fit within a circular optical element 26, similar to the image sensor 2 of FIG. 1.

Figure 3:
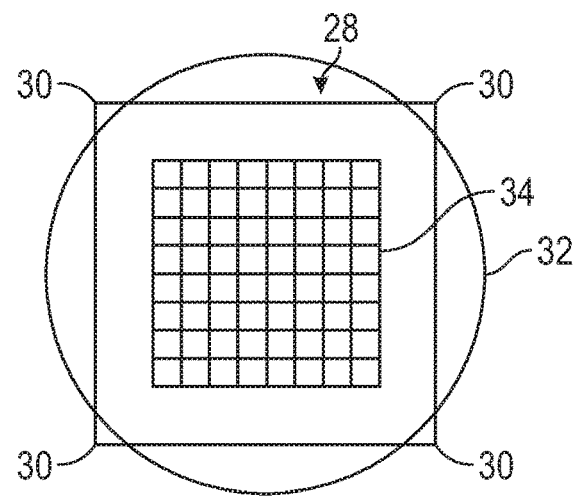
FIG. 3 is a top view of an image sensor with right-angled corners.

Referring to FIG. 3, a top view of an image sensor with right-angle corners is illustrated. The image sensor 28 of FIG. 3 is similar to the image sensors of FIGS. 1 and 2, with the difference being that the corners 30 of the image sensor are not rounded or chamfered. As a result, the image sensor 28 is not able to fit within the optical element 32 because the corners 30 have right angles. Contrary to this, the image sensors of FIGS. 1-2 are able to fit within their respective optical elements due to the rounded or chamfered corners. As a result, the image sensors of FIGS. 1-2, which have the same sized pixel array as the pixel array 32 of FIG. 3, are able to fit within a smaller optical element, thus reducing the overall size of the camera system without compromising the quality or performance of the image sensor. This is in part because the material of the die at the corners generally does not include components needed to operate the image sensor and so represents extra material in various implementations.

The implementations illustrated by FIGS. 1-3 have optical elements illustrated as the same size and image sensors also illustrated as essentially the same size, with the only difference being that the edges of the image sensors of FIGS. 1-2 are respectively rounded and chamfered. In various implementations, the dimensions of the image sensor and/or optical elements may vary. In one example of a particular implementation, the diameter of the optical element may be substantially 7.5 millimeters (mm). The length of the image sensor may be substantially 5.7 mm, and the perimeter of the image sensor may be a square. The length of each side of the pixel array may be substantially 5 mm, and the length between the edge of the image sensor and the edge of the pixel array may be substantially 0.25 mm.

Figure 4:
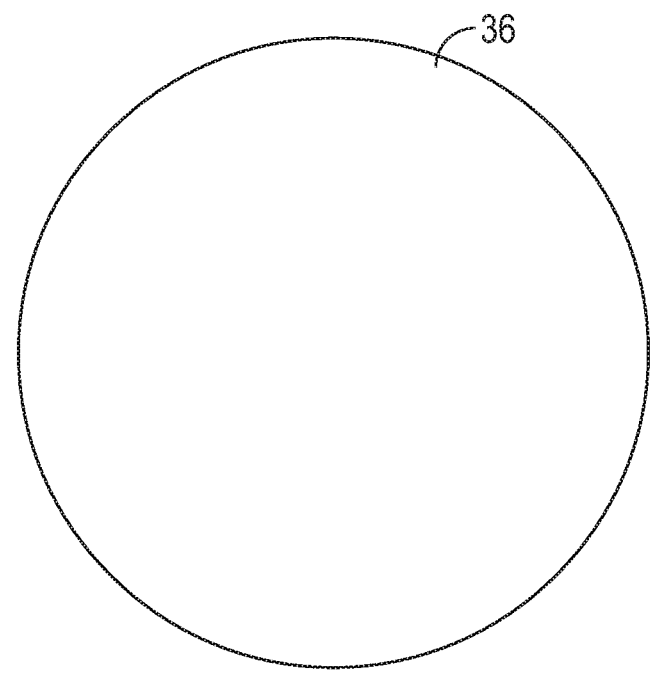
FIG. 4 is a top view of a cover.

Referring to FIGS. 4-8, a process for forming the image sensor of FIG. 1 or FIG. 2 is illustrated. Referring specifically to FIG. 4, a top view of a cover is illustrated. The method of forming an image sensor includes providing a cover, and the cover may be an optically transmissive cover 36. In various implementations, the optically transmissive cover is optically transparent, while in other implementations the optically transmissive cover is optically translucent. In various implementations, the optically transmissive cover 36 may be, by non-limiting example, glass, sapphire, or any other optically transmissive material. While the optically transmissive cover is illustrated as being circular in FIG. 4, in various implementations the cover may be other shapes.

Figure 5:
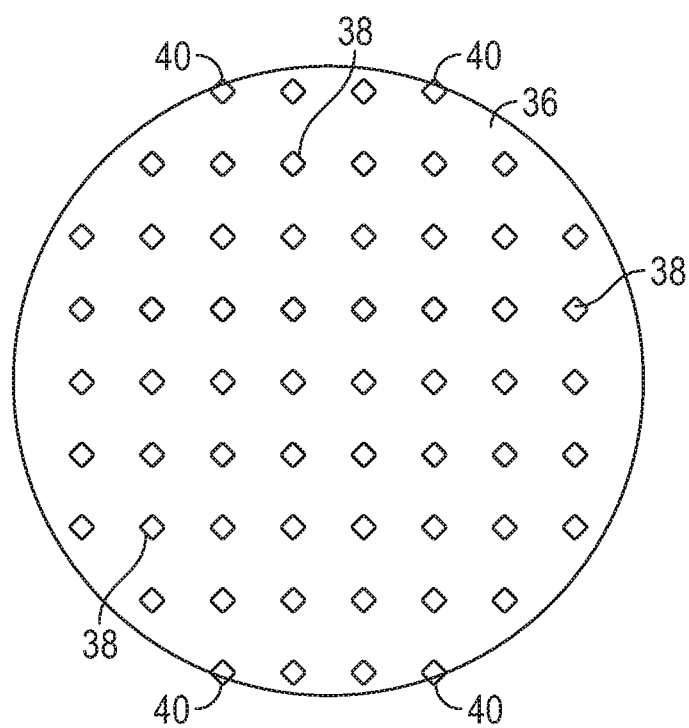
FIG. 5 is a top view of the cover of FIG. 4 with openings formed therein.

Referring to FIG. 5, a top view of the cover of FIG. 4 with openings formed therein is illustrated. The method of forming an image sensor may include forming a first plurality of openings 38 in the transmissive cover 36. In various implementations, a width of the openings may be substantially 0.5 mm, however, in other implementations the width of the openings may be more or less than 0.5 mm. As illustrated by FIG. 5, in various implementations each opening of the first plurality of openings includes a perimeter in, by non-limiting example, a closed four-sided shape, a circular shape, or an elliptical shape. By non-limiting example, the closed four-sided shape may include a rhombus, such as a square or diamond, a rectangle, or any other quadrilateral. Further, the closed four-sided shape of the perimeter of the opening may include a rhombus, such as a diamond, with curved concave edges. In various implementations, and as illustrated by FIG. 5, not each of the openings within the first plurality of openings 38 is formed entirely within the optically transmissive cover 36. In particular implementations, openings 40 of the plurality of openings 38 formed on the edge of the optically transmissive cover may form an opening partially within the perimeter of the optically transmissive cover 36. To illustrate this point in FIG. 5, the perimeter of the openings that extend across the perimeter of the cover 36 is shown, though in actual fact the edge of the openings across the perimeter would not actually exist. The number of openings within the first plurality of openings 36, as well as the spacing between the openings of the first plurality of openings may depend on the number and positioning of corners of a plurality of die containing image sensing elements, as explained later herein. In particular implementations, the first plurality of openings 38 may be etched through the optically transmissive cover. In such implementations, the openings may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the first plurality of openings 38 in the optically transmissive cover 36.

Figure 6:
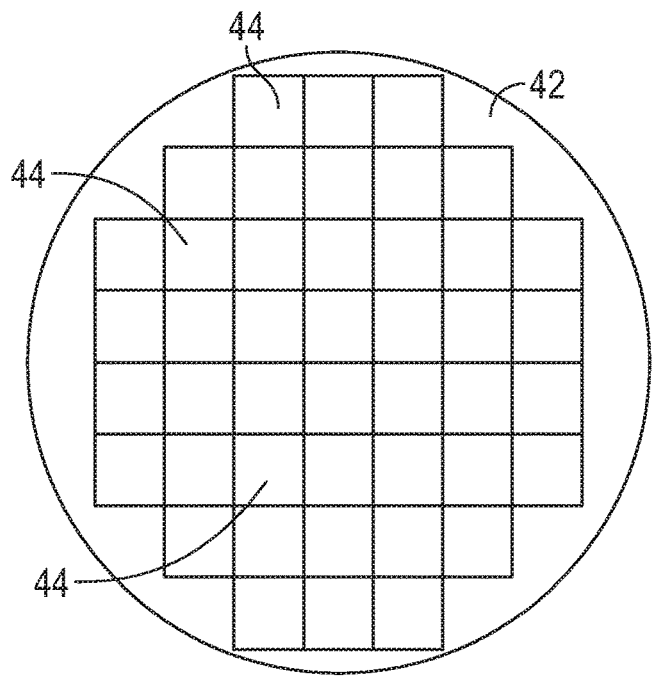
FIG. 6 is a top view of a wafer.

Referring to FIG. 6, a top view of a wafer is illustrated. The method for forming the image sensor includes providing a wafer 42 including a plurality of die 44. Each die of the plurality of die 44 may include image sensing elements, such as a pixel array. In various implementations, the plurality of die 44 may be any disclosed in this document. In various implementations, a perimeter of each die may be rectangular or a square. In other implementations, the perimeter of each die within the plurality of dies 44 may be a different shape and correspondingly, the shape of the openings in the cover may be varied according to the perimeter of each die.

Figure 7:
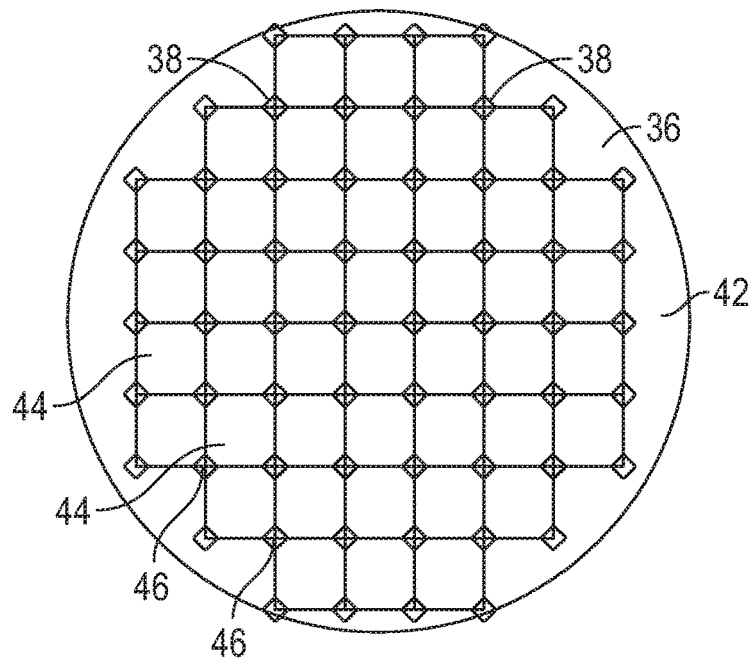
FIG. 7 is a top view of the cover of FIG. 5 aligned over the wafer of FIG. 6.

Referring to FIG. 7, a top view of the cover of FIG. 5 aligned over the wafer of FIG. 6 is illustrated. The method for forming the image sensor includes aligning the first plurality of openings 38 of the optically transmissive cover 36 with a plurality of corners 46 of the plurality of die 44. As illustrated by FIG. 7, in implementations where a corner of a die is adjacent to three other corners of three other die, a single respective opening in the optically transmissive cover is aligned to cover the corner of each of the four adjacent die. The optically transmissive cover 36 may be aligned with the wafer 42 using various alignment techniques, including, by non-limiting example, notch alignment of the optically transmissive cover with the wafer, optical alignment using alignment features on the wafer, optical alignment using the shapes of the plurality of openings and the streets of the die on the wafer, any combination thereof, and any other method of ensuring the openings are aligned over the corners of the die.

The method of forming an image sensor may include coupling the optically transmissive cover 36 to the wafer 42 having the plurality of die 44. In various implementations, the optically transmissive cover 36 may be coupled to the wafer 42 using an adhesive or bonding material. In such implementations, the adhesive may be applied between the wafer 42 and the optically transmissive cover 36 in specific locations so as to not interfere with the pixel array.

The method for forming an image sensor includes forming a second plurality of openings through the wafer 42. The second plurality of openings correspond in shape, size, and location, to the first plurality of openings 38, and as a result, are formed at the plurality of corners 46 of each die of the plurality of die 44. In various implementations, the second plurality of openings may be etched through the wafer 42 using any etching technique previously disclosed herein. In particular implementations, the optically transmissive cover 36 may be used as a guide to etch the second plurality of openings through the die. In such implementations, the method may include coupling a mask (not illustrated) to the optically transmissive cover 36. The mask may be formed using various lithographic processes or formed from application of a film followed by patterning or application of a patterned film over the optically transmissive cover 36. The mask has a plurality of openings that correspond with the first plurality of openings 38. The optically transmissive cover may be considered a guide as it dictates where the openings in the mask are located and the openings in the wafer are formed. The mask may be coupled to the optically transmissive cover in order to prevent additional etching or damage to the optically transmissive cover 36. The second plurality of openings may be formed through the wafer 42 using the mask coupled to the optically transmissive cover. This method may ensure that the first plurality of openings 38 and the second plurality of openings correspond. In other implementations, the optically transmissive cover may be used as the mask without covering it with a masking material. In still other implementations, the second plurality of openings may be partially or entirely formed or etched from the side of the wafer 42 opposite the side of the wafer coupled to the optically transmissive cover 36. In various implementations, the etching of the wafer 42 may be timed using to the etch rate of the silicon or other wafer material to ensure that the etch of the wafer 42 does not significantly continue to etch the optically transmissive cover 36.

In other implementations, the method of forming the image sensor may include coupling an optically transmissive cover without any openings to a wafer. In such implementations, the method may include forming a mask over the optically transmissive cover with a plurality of openings therein which align with the plurality of corners of the plurality of die in the wafer. The method may include etching through both the optically transmissive cover and the wafer using the mask coupled to the optically transmissive cover.

In various implementations, the method of forming the image sensor may include performing other procedures, like forming (or etching) through-silicon-vias (TSV) in the wafer followed by forming a redistribution layer (RDL) and solder balls or bumps used to couple the image sensor to an external device. Such procedures may be performed at the same time the second plurality of openings are formed through the wafer 42. In particular implementations, the TSVs and the second plurality of openings may be simultaneously formed through a wet etch process.

Figure 8:
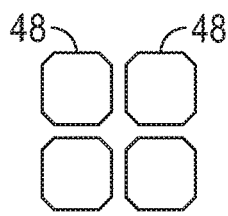
FIG. 8 is a top view of four die after the wafer and cover of FIG. 7 has been singulated.

Referring to FIG. 8, a top view of four image sensor devices after the wafer and the cover of FIG. 7 have been singulated is illustrated. The method for forming the image sensor includes singulating the optically transmissive cover and the wafer into a plurality of image sensor devices 48. The singulation may take place using, by non-limiting example, saw cutting, laser cutting, water cutting, any combination thereof, and any other method of cutting the material of the cover and/or wafer. As illustrated by FIG. 8, each image sensor device of the plurality of image sensor device 48 includes a plurality of chamfered corner edges. The chamfered corner edges may be the result of forming quadrilateral, or diamond shaped, openings over the corners of each die of the plurality of die of the wafer. In other implementations, the singulated image sensor devices 48 may each have rounded corners, similar to the image sensor of FIG. 1. In such implementations, the first plurality of openings 36 of the optically transmissive cover may have included openings with a perimeter in a diamond shape having concave edges in order to form the convex rounded corners (similar to the corners of FIG. 1). Alternatively, the first plurality of openings 36 of the optically transmissive cover may have included openings with a perimeter in the shape of a circle or an ellipse in order to form concave rounded corners of the image sensors.

In various implementations, the wafer 42 and optically transmissive cover 36 are singulated using a saw. In such implementations, the width of the saw blade is less than the width of each opening of the first or second plurality of openings. In this manner, the corners of each die may be rounded or chamfered. In other implementations, the wafer is singulated using, by non-limiting example, a laser, water jet, or other singulation device.

By rounding or chamfering the corners of the die and the cover of the image sensor, the image sensor is able to fit within smaller optical elements, such as a lens holder, which is often circular. This method may allow for an overall smaller camera system without having to decrease the size of the pixel array or sacrifice image quality in exchange for a smaller camera system. Further, many optical elements, such as lens holders, vary slightly in size, thus the image sensors will also need to vary slightly in size to accommodate the various sizes of optical elements. By altering the size of the openings in the cover and the die while forming the image sensor, different sized image sensors may be produced easily without having to manufacture different silicon wafers. The width of the saw blade singulating the image sensors may also be varied to alter the size of the image sensors without having to manufacture different silicon wafers.

Though this application primarily focuses on the structure of an image sensor and the method for forming the image sensor, the methods disclosed herein may be applied to other semiconductor devices which are not image sensors. In various implementations, rather than having an optically transmissive cover coupled to the wafer, a cover that is not optically transmissive may be coupled to a wafer that includes a plurality of die. In such implementations, the cover may be a metal layer, another wafer, a semiconductor material, or another material formed into a planar layer, which may or may not have the same perimeter as the wafer. In other implementations, rather than the device having a cover, the methods and techniques disclosed herein may apply to the formation of stacked/bonding die. In such implementations, a first wafer comprising a plurality of die may have a plurality of openings etched therethrough. The first wafer may then be coupled to a second wafer also including a plurality of die, and a corresponding set of openings may be formed through the second wafer. The corresponding set of openings may be etched through the second wafer, and the first wafer may be used as a guide during the etching. Such methods and techniques may be employed in forming micro-electro-mechanical systems (MEMS) where the MEMS device is bonded to a second wafer which contains control or sensors that interact with the MEMS device.

In places where the description above refers to particular implementations of image sensors and implementing components, sub-components, methods and sub-methods, it should be readily apparent that a number of modifications may be made without departing from the spirit thereof and that these implementations, implementing components, sub-components, methods and sub-methods may be applied to other image sensors.

What is claimed is:

1. An image sensor comprising:
a die comprising a rounded corner or a chamfered corner edge; and
an optically transmissive cover coupled to the die;
wherein a perimeter of the optically transmissive cover is aligned with a perimeter of the die; and
wherein the perimeter of the optically transmissive cover is not set in from the perimeter of the die.

2. The image sensor of claim 1, wherein the rounded corner or the chamfered corner edge of the die is convexly rounded.

3. The image sensor of claim 1, wherein the rounded corner or the chamfered corner edge of the die is concavely rounded.

4. The image sensor of claim 1, wherein the optically transmissive cover comprises glass.

5. The image sensor of claim 1, wherein the rounded corner or the chamfered corner edge of the die are formed through etching.

6. The image sensor of claim 1, wherein two or more sidewalls of the optically transmissive cover are aligned with two or more sidewalls of the die.

7. An image sensor comprising:
a die comprising a rounded corner or a chamfered corner edge; and
an optically transmissive cover coupled to the die;
wherein the optically transmissive cover comprises a rounded corner or a chamfered corner edge;
wherein a perimeter of the optically transmissive cover is substantially the same size as a perimeter of the die; and
wherein the rounded corner or the chamfered corner edge of the optically transmissive cover is not set in from the rounded corner or the chamfered corner edge of the die.

8. The image sensor of claim 7, wherein the rounded corner or the chamfered corner edge of the die is convexly rounded.

9. The image sensor of claim 7, wherein the rounded corner or the chamfered corner edge of the die is concavely rounded.

10. The image sensor of claim 7, wherein the optically transmissive cover comprises glass.

11. The image sensor of claim 7, wherein the rounded corner or the chamfered corner edge of the die are formed through etching.

12. An image sensor comprising:
a die comprising a rounded corner or a chamfered corner edge; and
an optically transmissive cover coupled to the die;
wherein the optically transmissive cover comprises a rounded corner or a chamfered corner edge; and
wherein the rounded corner or the chamfered corner edge of the optically transmissive cover is not set in from the rounded corner or the chamfered corner edge of the die.

13. The image sensor of claim 12, wherein the rounded corner or the chamfered corner edge of the die is convexly rounded.

14. The image sensor of claim 12, wherein the rounded corner or the chamfered corner edge of the die is concavely rounded.

15. The image sensor of claim 12, wherein the optically transmissive cover comprises glass.

16. The image sensor of claim 12, wherein the rounded corner or the chamfered corner edge of the die are formed through etching.

17. The image sensor of claim 12, wherein the rounded corner or the chamfered corner edge of the optically transmissive cover lines up with the rounded corner or the chamfered corner edge of the die.

* * * * *